United States Patent
Nakayama

(10) Patent No.: US 7,687,986 B2
(45) Date of Patent: Mar. 30, 2010

(54) ORGANIC EL DEVICE HAVING HOLE-INJECTION LAYER DOPED WITH METALLIC OXIDE

(75) Inventor: Masaya Nakayama, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 577 days.

(21) Appl. No.: 11/441,168

(22) Filed: May 26, 2006

(65) Prior Publication Data

US 2006/0279190 A1   Dec. 14, 2006

(30) Foreign Application Priority Data

May 27, 2005   (JP)   ............................. 2005-154951

(51) Int. Cl.
*H05B 33/00*   (2006.01)
(52) U.S. Cl. ...................... 313/504; 313/506
(58) Field of Classification Search .......... 313/504–512
See application file for complete search history.

(56) References Cited

U.S. PATENT DOCUMENTS

| 6,278,236 | B1* | 8/2001 | Madathil et al. | ............ | 313/504 |
| 2005/0110400 | A1* | 5/2005 | Nakamura | .................. | 313/506 |
| 2006/0240281 | A1* | 10/2006 | Liao et al. | .................... | 428/690 |

FOREIGN PATENT DOCUMENTS

| CN | 1610470 A | 4/2005 |
| CN | 1922928 A | 2/2007 |
| JP | 2001-52878 A | 2/2001 |
| JP | 3488474 B2 | 10/2003 |
| JP | 2004-192890 A | 7/2004 |
| JP | 2004-228082 A | 8/2004 |
| WO | WO-01/39554 A1 | 5/2001 |

OTHER PUBLICATIONS

Riel et al., Journal of Applied Physics, vol. 94, No. 8, pp. 5290-5296, (Oct. 15, 2003).
Hung et al., Appl. Phys. Lett., vol. 70, No. 2, pp. 152-154, (Jan. 13, 1997).

* cited by examiner

*Primary Examiner*—Joseph L Williams
(74) *Attorney, Agent, or Firm*—Birch, Stewart, Kolasch & Birch, LLP

(57) ABSTRACT

A top-emission-type organic EL device comprising a substrate and at least a light-reflective anode, a hole-injection layer comprising first and second hole-injection layers, a hole-transport layer, a light-emitting layer, an electron-transport layer, and a light-transmitting cathode, which are sequentially laminated on the substrate, wherein the light-reflective anode side of hole-injection layer (the first hole-injection layer) is doped with a metallic oxide.

21 Claims, 2 Drawing Sheets

_US 7,687,986 B2_

ORGANIC EL DEVICE HAVING HOLE-INJECTION LAYER DOPED WITH METALLIC OXIDE

CROSS-REFERENCE TO RELATED APPLICATION

This application claims priority under 35 USC 119 from Japanese Patent Application No. 2005-154951, the disclosure of which is incorporated by reference herein.

BACKGROUND OF THE INVENTION

1. Field of the Invention

The present invention relates to a method to achieve higher light-emission efficiency and longer operating life for a top-emission-type organic EL device, in which light is taken out from the upper electrode of the device.

2. Description of the Related Art

A display apparatus in which an organic EL device can be practically used as a display device is currently under active research and development.

Particularly, a top-emission-type organic EL device, in which light is emitted through an upper electrode provided on the opposite side of a substrate, has an advantage over a bottom-emission-type organic EL device, in which light is emitted through a lower electrode on the side of a substrate, especially when used in an active-matrix-type display apparatus wherein TFTs (thin film transistors) are employed. This is because the aperture ratio of the display device can be increased, since there is no light shielding by the TFT matrix, and higher brightness and longer life can be achieved.

FIG. 3 is a sectional side view of relevant parts illustrating a bottom-emission-type organic EL device of the conventional art, wherein 1 indicates a transparent substrate, 2 indicates an anode comprising a transparent electrode, 3 indicates an organic layer comprising a light-emitting layer (not shown), and 4 indicates a cathode.

In the bottom-emission-type organic EL device shown in FIG. 3, light emitted from the light-emitting layer in the organic layer 3 is taken out from the transparent substrate 1 via the anode 2 (see, for example, L. S. Hung, C. W. Tang and M. G. Mason, Applied Physics Letters, Vol. 70 (2), 152 (1997)).

This bottom-emission-type organic EL device generally uses a glass for the transparent substrate 1, an ITO (indium tin oxide) for the anode 2 comprising a transparent electrode, and an Al for the cathode 4. Further, there are cases of using a LiF/Al structure, which is an Al cathode having an LiF electron-injection-layer on its interfacing surface to the organic layer 3 to facilitate the electron-injection from the cathode 4 to the organic layer 3.

FIG. 4 is a sectional side view of relevant parts illustrating a top-emission-type organic EL device of the conventional art, wherein 11 indicates a nonconductive substrate, 12 indicates an anode, 13 indicates an organic layer comprising a light-emitting layer (not shown), and 14 indicates a cathode comprising a light-transmitting electrode.

In the top-emission-type organic EL device shown in FIG. 4, light emitted from the light-emitting layer in the organic layer 13 is taken out from the cathode 14 comprising a light-transmitting electrode.

A transparent electrode, e.g. an ITO, is typically used for the cathode 14 in the top-emission-type organic EL device. However, it is said that when a semi-transparent electrode, e.g. an Mg thin film or an Ag thin film, is used for the cathode 14, and a light-reflective electrode, e.g. a Pt, Au or a Cr thin film, is used for the anode 12, a multiple interference occurs between the cathode 14 and the anode 12, creating a microcavity effect, whereby an emission spectrum is made steeper than that of the bottom-emission-type organic EL device, hence the color purity is increased (see WO01-039554, for example).

Further improvement in light-emission-efficiency can be expected by using a highly light-reflective metal such as an Ag or an Al for the anode 12. However, the electron hole may not be easily injected directly from the Ag or Al layer into the organic layer 13, causing a rise in operating voltage of the organic EL device.

To overcome such a problem, methods to improve the hole injection property of the top-emission-type organic EL device, e.g. designing an anode to have an Al—Cu/Ni/NiO$_x$/V$_2$O$_5$ structure (see the specification of Japanese Patent No. 3488474, for example), an Ag/ITO structure (see the Japanese Patent Application Laid-Open No. 2004-192890, for example) and an Al/Ni structure (see J. Appl. Phys., Vol. 94, No. 8, 5290 (2003), for example), have been known.

In addition, as a method to achieve not only better color purity but also better light-emission efficiency compared to a conventional bottom-emission-type organic EL device, there has been disclosed use of a top-emission-type organic EL device in which an Ag anode, a hole-injection layer comprising a CFx and a MoOx and an Ag semi-transparent electrode in the cathode are used, and the thickness of an organic layer is optimized (see Japanese Patent Laid-Open Publication No. 2004-228082, for example).

As a technique using an Ag thin film as the cathode, there has been reported a method wherein an Al super-thin film having a thickness of 0.6 nm is sandwiched between a LiF electron-injection layer and an Ag thin-film cathode so that good voltage-current density property is obtained (see Japanese Patent Application Laid-Open No. 2001-52878, for example).

Therefore, it is said that the top-emission-type organic EL device, utilizing the above-mentioned microcavity effect, has the potential to realize an active-matrix-type display apparatus having advanced color purity and light-emission efficiency, high degree of brightness, light-emission efficiency and color reproducibility.

However, according to the present inventor's findings, the top-emission-type organic EL device still has technical problems associated with the operation life, and no case of realization of a lifetime long enough to endure practical use has been reported. In particular, a device comprising an Al/Ni anode disclosed in the above-mentioned J. Appl. Phys., Vol. 94, No. 8, 5290 (2003), for example, exhibits inferior life property.

SUMMARY OF THE INVENTION

The present invention has been made in view of the above circumstances and provides an organic EL device.

An aspect of the present invention provides an organic EL device comprising a substrate having at least a light-reflective anode, a hole-injection layer comprising first and second hole-injection layers, a hole-transport layer, a light-emitting layer, an electron-transport layer, and a light-transmitting cathode, which are sequentially laminated on the substrate, wherein the light-reflective anode side of hole-injection layer (the first hole-injection layer) is doped with a metallic oxide.

DETAILED DESCRIPTION OF THE INVENTION

The organic EL device of the present invention basically provides an organic EL device comprising a substrate and layers of at least a light-reflective anode, a hole-injection layer comprising first and second hole-injection layers, a hole-transport layer, a light-emitting layer, an electron-transport layer, and a light-transmitting cathode, which are sequentially laminated on the substrate, wherein the light-reflective anode side of hole-injection layer (the first hole-injection layer) is doped with a metallic oxide.

The metallic oxide to be doped into the hole-injection layer, which is an organic film, is preferably a vanadium oxide ($V_2O_5$) or a molybdenum oxide ($MoO_3$); Preferable material for the light-reflective anode is an Al, an Al alloy such as an Al—Nd; Preferable material for the anode buffer layer may be selected from a molybdenum oxide, a vanadium oxide, a nickel oxide (NiO), a molybdenum (Mo), a nickel (Ni) and the like, and particularly preferably, a molybdenum oxide.

By applying the above-mentioned device, the operating life of top-emission-type organic EL device could become longer; and the light-emission efficiency could become higher if the use of an Al or an Al alloy, the material being said to have not only a higher light reflectivity but also shorter operating life, for the light-reflective anode becomes possible; and further an operating voltage could be lowered by depositing an anode buffer layer comprising a metal having a work function of 4.3 eV or higher or a metallic oxide thereof between the light-reflective anode of Al or the like and the hole-injection layer. Therefore, a top-emission-type organic EL device having a wider color reproduction range as a whole, longer operation life, higher efficiency and a lower operating voltage can be realized.

Figure 1:
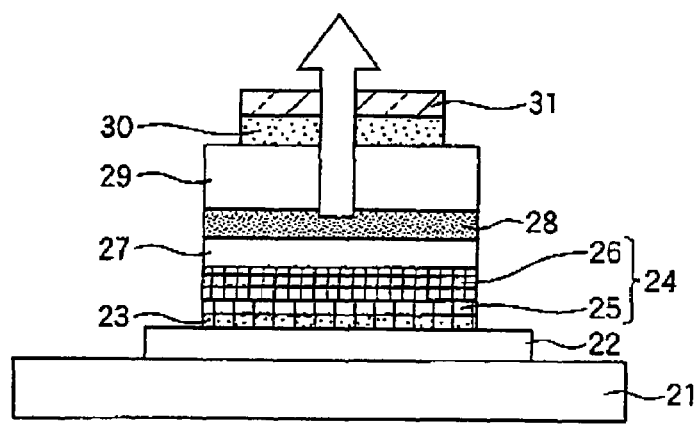
FIG. 1 is a sectional side view of relevant parts of the organic EL device illustrating one embodiment of the present invention.

FIG. 1 is a sectional side view of relevant parts of the organic EL device illustrating one embodiment of the present invention, wherein 21 indicates a substrate, 22 indicates a light-reflective anode, 23 indicates an anode buffer layer, 24 indicates a hole-injection layer comprising a first hole-injection layer 25 and a second hole-injection layer 26, 27 indicates a hole-transport layer, 28 indicates a light-emitting layer, 29 indicates an electron-transport layer, 30 indicates a light-transmitting cathode and 31 indicates a capping layer.

As the substrate 21 of organic EL device in FIG. 1, a transparent nonconductive substrate of glass, quartz or the like, a flexible substrate of PET or the like, a semiconductor substrate of Si or the like, or such types of substrate mounted with an on-off control circuit for the organic EL device constituting the switching elements such as TFTs formed in matrix, may be used. When a flexible substrate is used as the substrate 21, a flexible display which can be disposed on a curbed surface of outer casing of devices can be obtained because of its flexibility.

As the flexible substrate, as shown in Japanese Patent Application Laid-Open No. 2002-82627, a metallic film substrate containing e.g. stainless, Fe, Al, Ni, Co, Cu and alloys thereof, a plastic film substrate containing e.g. PET (poly (ethylene terephthalate)), PEN (poly(ethylene naphthalate)), PES (poly(ether sulphone)) and PO (polyolefin), or the plastic film substrate provided with a gas barrier layer on the surface, can be used.

As the material for the light-reflective anode 22, an Al or an alloy thereof such as an Al—Nd, Ag or an alloy thereof, a Mo, a Cr or the like may be used.

An ITO, which is conventionally used for the anode, is not suitable for a flexible display because the ITO is susceptible to break for its little flexibility ("Printing Technology for Flexible Substrate", Toray Research Center, p. 84). However, by using the above-mentioned metals and alloys thereof for the light-reflective anode 22 on the flexible substrate, a desirable flexible display which is highly flexible and break-proof can be achieved.

For the hole-injection layer 24, a material having a high HOMO, i.e. a low ionization potential, typified by a copper phthalocyanine (CuPc) and a star-burst-type amine, e.g. an m-MTDATA and 2-TNATA (4,4',4"-tris(2-naphthylphenylamino)triphenylamine), may be used.

The first hole-injection layer 25 is a part of the above-mentioned hole-injection layer 24 doped with a metallic oxide, e.g. a $V_2O_5$ and a $MoO_3$.

The second hole-injection layer 26 is a part of the above-mentioned hole-injection layer 24, which may be either undoped or doped with a F4-TCNQ (2,3,5,6,-tetrafluoro-7,7,8,8,-tetracyanoquinodimethane) or the above-mentioned metallic oxides.

For the hole-transport layer 27, as with the hole-injection layer 24, a material having a high HOMO typified by a TPD, an α-NPD or the like may be used.

For the light-emitting layer 28, metal complex material such as an $Alq_3$ (tris(8-hydoxyquinoline) aluminum) and a $BAlq_2$, coloring agent material such as a PZ10 and a EM2, or a host material such as an $Alq_3$ or a CBP doped with a coloring agent such as a Rubrene, a t(dta)py (1,3,6,8-tetra(N,N-di-4-tolylamino)pyrene), and a tbppy (1,3,6,8-tetra(4-biphenyl) pyrene), may be also used.

For the electron-transport layer 29, a material having a low LUMO, typified by an $Alq_3$, a BCP and the like, is used to lower the barrier against the electron-injection from the light-transmitting cathode 30. By doping such material with a metal having a low work function, e.g. a Li and a Cs, the barrier against the electron-injection from the light-transmitting cathode 30 can be lowered.

For the light-transmitting cathode 30, a layer of an Ag or an Ag alloy, e.g. a Mg—Ag, having a thickness of 10 nm to 40 nm, can be used. To facilitate electron-injection from the light-transmitting cathode 30 to the electron-transport layer 29, an electron-injection layer having a thickness of 0.1 nm to 5 nm and comprising an alkaline fluoride such as LiF or the like can be provided between the light-transmitting cathode 30 and the electron-transport layer 29, and further, an Al layer having a thickness of approximately 0.2 nm to 3.0 nm is preferably provided thereon.

By using a semi-transparent electrode as the light-transmitting cathode 30, color purity of the light-emission spectrum can be improved by generating a microcavity effect caused by multiple-interference between the light-reflective anode 22 and the semi-transparent cathode 30.

Further, although not essential, it is preferable to form a capping layer 31 on the light-transmitting cathode 30. The capping layer 31 can effectively improve optical transmittance of the light-transmitting cathode 30, and a material having high degree of refractive index is preferably use. Highly refractive material, e.g. an ITO, a $TiO_2$ and a MgO can be used, but a zinc compound e.g. a ZnS, a ZuSe and a ZnTe has an advantage that they can be vacuum-deposited to form a film, besides being highly refractive. For the light-transmitting cathode 30, a transparent electrode typified by an ITO transparent electrode, can also be used.

In addition to the above-mentioned structure, an anode buffer layer 23 is preferably provided between the light-reflective anode 22 and the first hole-injection layer 2.5. For the anode buffer layer 23, material comprising a metal having a work function of 4.3 eV or higher or a metallic oxide thereof may be used. Examples of such material include a $MoO_3$, a $V_2O_5$, a NiO, a Mo, a Ni and the like, and most preferably a $MoO_3$. The thickness of the anode buffer layer 23 is preferably 0.5 to 10 nm so as not to impair the reflectivity of the light-reflective anode 22.

Hereinafter, illustrative embodiments of the present invention will be described.

1. An organic EL device comprising a substrate having at least a light-reflective anode, a hole-injection layer, a hole-transport layer, a light-emitting layer, an electron-transport layer and a light-transmitting cathode, which are sequentially laminated on the substrate, wherein the light-reflective anode side of hole-injection layer is doped with a metallic oxide.

2. The organic EL device of 1, wherein the metallic oxide to be doped is $V_2O_5$ or $MoO_3$.

3. The organic EL device of 1, wherein the light-reflective anode comprises Al or Al alloy.

4. The organic EL device of 1, wherein an anode buffer layer comprising a metal having a work function of 4.3 eV or more or an oxide thereof is sandwiched between the light-reflective anode and the hole-injection layer.

5. The organic EL device of 4, wherein an anode buffer layer comprising a material selected from the group consisting of $MoO_3$, $V_2O_5$, NiO, Mo and Ni is sandwiched between the light-reflective anode and the hole-injection layer.

6. The organic EL device of 1, wherein the light-reflective anode is subjected to a UV ozone surface treatment or an $O_2$ plasma surface treatment.

7. The organic EL device of 4, wherein the anode buffer layer is subjected to a UV ozone surface treatment or an $O_2$ plasma surface treatment.

8. The organic EL device of 1, wherein the doped metallic oxide is not present in the hole-transport layer side of hole-injection layer.

9. The organic EL device of 1, wherein the light-transmitting cathode is a semi-transparent cathode comprising Ag or Ag alloy.

10. The organic EL device of 9, wherein the electron-injection layer comprises an alkaline metal compound and a thin film comprising Al having a thickness of 0.5 nm to 3 nm is sandwiched between the semi-transparent cathode comprising Ag or Ag alloy and the electron-transport layer.

11. The organic EL device of 9, wherein a capping layer comprising ZnS is laminated on the semi-transparent cathode comprising Ag or Ag alloy.

12. The organic EL device of 1, wherein the substrate is a flexible substrate.

13. An organic EL device comprising a substrate having at least a light-reflective anode, a hole-injection layer comprising first and second hole-injection layers, a hole-transport layer, a light-emitting layer, an electron-transport layer and a light-transmitting cathode, which are sequentially laminated on the substrate, wherein the first hole-injection layer is doped with a metallic oxide.

14. The organic EL device of 13, wherein the metallic oxide to be doped is $V_2O_5$ or $MoO_3$.

15. The organic EL device of 13, wherein the light-reflective anode comprises Al or Al alloy.

16. The organic EL device of 13, wherein an anode buffer layer comprising a metal having a work function of 4.3 eV or more or an oxide thereof is sandwiched between the light-reflective anode and the hole-injection layer.

17. The organic EL device of 16, wherein an anode buffer layer comprising a material selected from the group consisting of $MoO_3$, $V_2O_5$, NiO, Mo and Ni is sandwiched between the light-reflective anode and the hole-injection layer.

18. The organic EL device of 13, wherein the light-reflective anode is subjected to a UV ozone surface treatment or an $O_2$ plasma surface treatment.

19. The organic EL device of 16, wherein the anode buffer layer is subjected to a UV ozone surface treatment or an $O_2$ plasma surface treatment.

20. The organic EL device of 13, wherein the doped metallic oxide is not present in the second hole-injection layer.

21. The organic EL device of 13, wherein the light-transmitting cathode is a semi-transparent cathode comprising Ag or Ag alloy.

22. The organic EL device of 13, wherein the substrate is a flexible substrate.

EXAMPLES

Hereinafter, specific examples, but not limited thereto, of the present invention is described below.

Example 1

(1) A glass substrate is subjected to an ultrasonic-wave cleaning with pure water, an acetone, pure water, and an IPA in the order thereof, for 15 minutes respectively.

(2) A light-reflective anode having a thickness of 60 nm is formed by performing a vapor deposition using a W filament to form an Al layer, and thereafter the surface of the substrate is treated with UV ozone for 20 minutes.

(3) A first hole-injection layer having a thickness of 20 nm is formed by performing a codeposition in accordance with a vacuum-deposition method, wherein a Ta boat and a Mo boat are used for a 2-TNATA and a $V_2O_5$ respectively so that the doping density of $V_2O_5$ is 33% by weight.

(4) A second hole-injection layer having a thickness of 165 nm is formed by performing a codeposition in accordance with a vacuum-deposition method, wherein a Ta boat and also a Ta boat are used for a 2-TNATA and a F4-TCNQ respectively so that the doping density of F4-TCNQ is 0.1% by weight.

(5) A hole-transport layer having a thickness of 10 nm is formed, by performing a vapor deposition using a Ta boat to form a NPD layer.

(6) A light-emitting layer having a thickness of 30 nm is formed by performing a codeposition of a t(dta)py and an $Alq_3$ in accordance with a vacuum-deposition method, using a Ta boat and also a Ta boat for the t(dta)py and the $Alq_3$ respectively, wherein the doping density of t(dta)py is 1% by weight.

(7) An electron-transport layer having a thickness of 20 nm is formed, by performing a vapor deposition using a Ta boat to form an $Alq_3$ layer.

(8) An electron-injection layer is formed by performing a vapor deposition in accordance with a vacuum-deposition method using a Mo boat to form a LiF layer having a thickness of 0.5 nm; and further performing a vapor deposition in accordance with a vacuum-deposition method using a W filament to form an Al layer having a thickness of 1.5 nm.

(9) A cathode is formed by performing a vapor deposition using a Mo boat to form an Ag layer having a thickness of 15 nm.

(10) A capping layer is formed by performing a vapor deposition using a Mo boat to form a ZnS layer having a thickness of 25 nm.

(11) A top-emission-type organic EL device obtained by the process (1) to (10) is sealed with a glass substrate using a UV adhesive, in a dried nitrogen atmosphere having a dew point temperature of −60° C. or below.

Example 2

In EXAMPLE 2, a Ni anode buffer layer having a thickness of 1 nm is formed on the Al light-reflective anode by performing a vapor deposition in accordance with a vacuum-deposition method, using a W filament, before the surface of the substrate is treated with a UV ozone for 20 minutes.

Accordingly, the hole-injection layer of EXAMPLE 2 is formed on the Ni layer, not on the Al layer as in the case of EXAMPLE 1.

Example 3

In EXAMPLE 3, a $MoO_3$ anode buffer layer having a thickness of 2 nm is formed on the Al light-reflective anode by performing a vapor deposition in accordance with a vacuum-deposition method, using a Mo boat.

Accordingly, the hole-injection layer of EXAMPLE 3 is formed on the $MoO_3$ layer, not on the Al or the Ni layer as in the case of EXAMPLE 1 or EXAMPLE 2.

Additionally, the thickness of the second hole-injection layer in EXAMPLE 3 is 170 nm, not 165 nm as in the case of EXAMPLE 2.

Example 4

In EXAMPLE 4, a first hole-injection layer is formed on the $MoO_3$ anode buffer layer, by performing a codeposition of a 2-TNATA and a $MoO_3$ so that the doping density of the $MoO_3$ is 30% by weight instead of a 2-TNATA and a $V_2O_5$ used in EXAMPLE 3.

Comparative Example 1

In COMPARATIVE EXAMPLE 1, a hole-injection layer having a thickness of 185 nm is formed on a Ni anode buffer layer after treated with a UV ozone, by performing a codeposition in accordance with a vacuum-deposition method wherein a Ta boat and also a Ta boat are used for a 2-TNATA and a F4-TCNQ respectively so that the doping density of the F4-TCNQ is 0.1% by weight.

Accordingly, no first hole-injection layer is created in COMPARATIVE EXAMPLE 1, contrary to the case of EXAMPLE 1 to 4.

Comparative Example 2

(1) A glass substrate having an ITO anode thereon is subjected to an ultrasonic-wave cleaning with pure water, an acetone, pure water, and an IPA in the order thereof, for 15 minutes respectively.

(2) A second hole-injection layer having a thickness of 185 nm is formed by performing a codeposition in accordance with a vacuum-deposition method wherein a Ta boat and also a Ta boat are used for a 2-TNATA and a F4-TCNQ respectively so that the doping density of F4-TCNQ is 0.1% by weight.

(3) A hole-transport layer having a thickness of 10 nm is formed by performing a vapor deposition in accordance with a vacuum-deposition method using a Ta boat to form a NPD layer.

(4) A light-emitting layer having a thickness of 30 nm is formed by performing a codeposition in accordance with a vacuum-deposition method, wherein a Ta boat and also a Ta boat are used for a t(dta)py and an $Alq_3$ respectively so that the doping density of t(dta)py is 1% by weight.

(5) An electron-transport layer having a thickness of 20 nm is formed by performing a vapor deposition using a Ta boat to form an $Alq_3$ layer.

(6) An electron-injection layer having a thickness of 0.5 nm is formed by performing a vapor deposition in accordance with a vacuum-deposition method using a Mo boat to form a LiF layer.

(7) A cathode having a thickness of 80 nm is formed by performing a vapor deposition in accordance with a vacuum-deposition method using a W filament to form an Al layer.

(8) A top-emission-type organic EL device obtained by the process (1) to (7) is sealed with a glass substrate using a UV adhesive, in a dried nitrogen atmosphere having a dew point temperature of −60° C. or below.

Comparative Example 3

COMPARATIVE EXAMPLE 3 is a bottom-emission-type organic EL device as with COMPARATIVE EXAMPLE 2, which has the same structure of first and second hole-injection layers as EXAMPLEs 1 and 2.

[Evaluation]

Table 1 shows the structure of the devices in EXAMPLE 1 to 4 and COMPARATIVE EXAMPLE 1 to 3.

Table 2 shows the characteristics of the devices when a drive current is 15 mA/cm$^2$.

Figure 2:
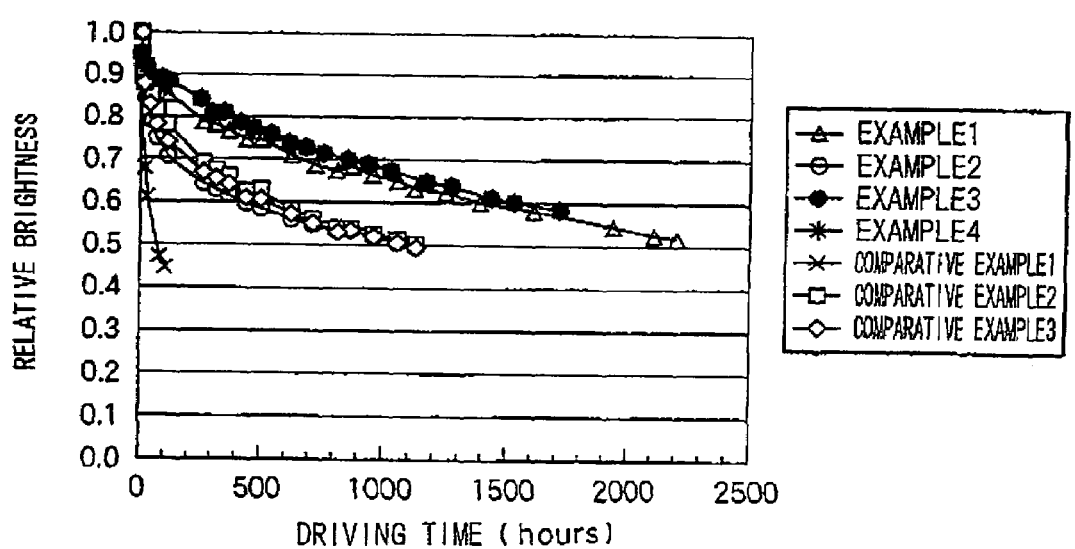
FIG. 2 is a diagram slowing the brightness degradation of the devices used when a drive current is 15 mA/cm$^2$.
Figure 3:
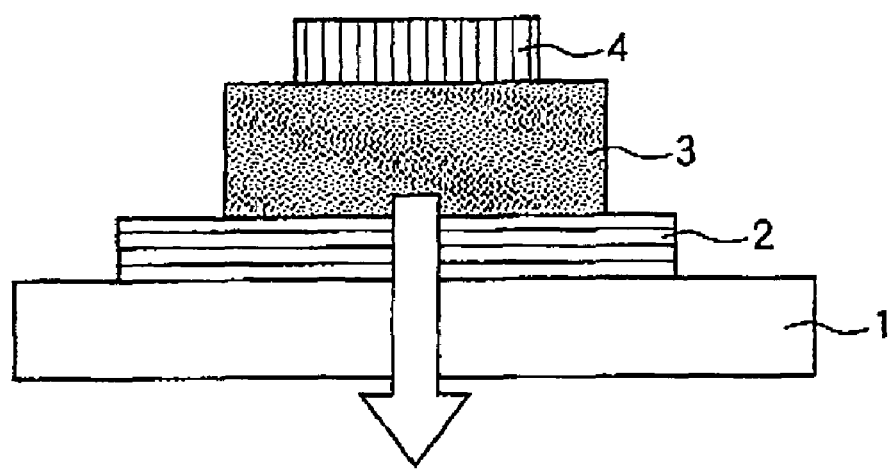
FIG. 3 is a sectional side view of relevant parts of a bottom-emission-type organic EL device based on the conventional art.
Figure 4:
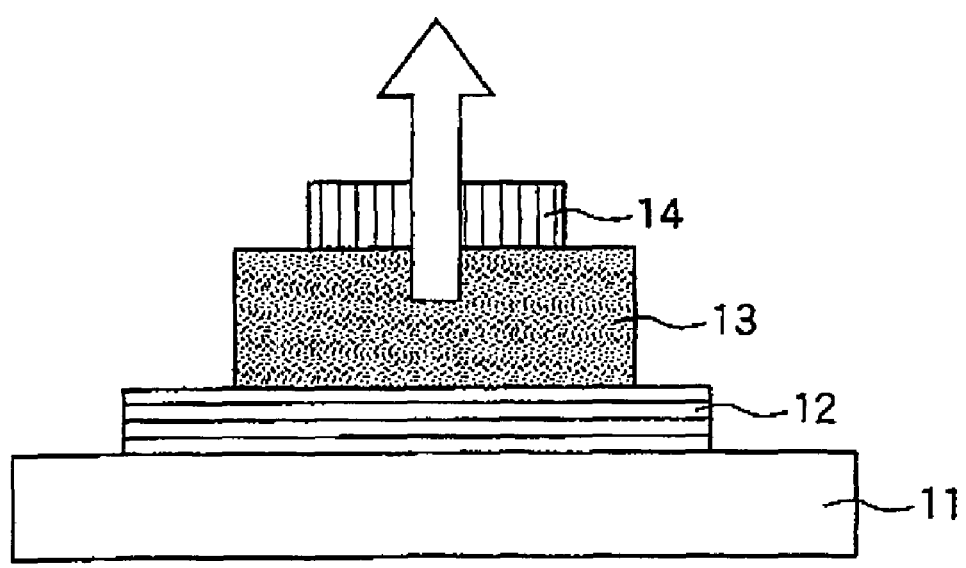
FIG. 4 is a sectional side view of relevant parts of a top-emission-type organic EL device based on the conventional art.

FIG. 2 shows the state of brightness degradation when a drive current is 15 mA/cm$^2$. These organic EL devices all emit green light.

COMPARATIVE EXAMPLE 1 is a top-emission-type organic EL device having an anode and a hole-injection layer formed in accordance with the conventional art, and COM- PARATIVE EXAMPLE 2 is a bottom-emission-type organic EL device structured in accordance with the conventional art.

In COMPARATIVE EXAMPLE 1, it is found that color purity, and also light-emission efficiency, are improved by using an Al light-reflective anode and an semi-transparent cathode to cause the above-described microcavity effect whereby the light-emission n is made steeper.

However, brightness of COMPARATIVE EXAMPLE 1 has a half-life of only 65 hours, which is significantly inferior to 1,000 hours of COMPARATIVE EXAMPLE 2.

On the other hand, half-life of brightness of EXAMPLE 1 is greatly improved up to 2300 hours, which is 2.3 times as long as that of COMPARATIVE EXAMPLE 2, while color purity and light-emission efficiency are as high as these of COMPARATIVE EXAMPLE 1.

In EXAMPLE 2, high degree of color purity and light-emission efficiency are also achieved, and at the same time brightness is improved up to half-life of 1,000 hours, which is equivalent to COMPARATIVE EXAMPLE 2.

In EXAMPLE 3 and 4, half-life of brightness equivalent to EXAMPLE 1 is obtained by applying $MoO_3$ for an anode buffer layer. Furthermore, drive voltage is lowered and light-emission efficiency is improved.

In COMPARATIVE EXAMPLE 2 and COMPARATIVE EXAMPLE 3, both using an ITO anode, no difference was observed in the length of brightness half-life.

Example 5

(1) A glass substrate is subjected to an ultrasonic-wave cleaning with pure water, an acetone, pure water, and an IPA in the order thereof, for 15 minutes respectively.

(2) A light-reflective anode having a thickness of 60 nm is formed by performing a vapor deposition using a W filament to form an Al layer, and thereafter the surface of the substrate is treated with UV ozone for 20 minutes.

(3) An anode buffer layer having a thickness of 2 nm is formed by performing a vapor deposition in accordance with a vacuum-deposition method, using a Mo boat to form a $MoO_3$ layer.

(4) A first hole-injection layer having a thickness of 20 nm is formed by performing a codeposition in accordance with a vacuum-deposition method, wherein a Ta boat and a Mo boat are used for a 2-TNATA and a $MoO_3$ respectively so that the doping density of $MoO_3$ is 30% by weight.

TABLE 1

| | Anode | Anode buffer layer | 1st hole injection layer | 2nd hole injection layer | Hole transport layer | Light emitting layer | Electron transport layer | Electron injection layer | Cathode | Capping layer |
|---|---|---|---|---|---|---|---|---|---|---|
| EXAMPLE 1 | Al (60 nm) | not given | 33% $V_2O_5$ + 2-TNATA (20 nm) | 0.1% F4-TCNQ + 2-TNATA (165 nm) | NPD (10 nm) | 1% t(dta)py + $Alq_3$ (30 nm) | $Alq_3$ (20 nm) | LiF (0.5 nm)/Al (1.5 nm) | Ag (15 nm) | ZnS (25 nm) |
| EXAMPLE 2 | Al (60 nm) | Ni (1 nm) | 33% $V_2O_5$ + 2-TNATA (20 nm) | 0.1% F4-TCNQ + 2-TNATA (165 nm) | NPD (10 nm) | 1% t(dta)py + $Alq_3$ (30 nm) | $Alq_3$ (20 nm) | LiF (0.5 nm)/Al (1.5 nm) | Ag (15 nm) | ZnS (25 nm) |
| EXAMPLE 3 | Al (60 nm) | $MoO_3$ (2 nm) | 33% $V_2O_5$ + 2-TNATA (20 nm) | 0.1% F4-TCNQ + 2-TNATA (170 nm) | NPD (10 nm) | 1% t(dta)py + $Alq_3$ (30 nm) | $Alq_3$ (20 nm) | LiF (0.5 nm)/Al (1.5 nm) | Ag (15 nm) | ZnS (25 nm) |
| EXAMPLE 4 | Al (60 nm) | $MoO_3$ (2 nm) | 30% $MoO_3$ + 2-TNATA (20 nm) | 0.1% F4-TCNQ + 2-TNATA (170 nm) | NPD (10 nm) | 1% t(dta)py + $Alq_3$ (30 nm) | $Alq_3$ (20 nm) | LiF (0.5 nm)/Al (1.5 nm) | Ag (15 nm) | ZnS (25 nm) |
| COMPAR. EXAMPLE 1 | Al (60 nm) | Ni (1 nm) | not given | 0.1% F4-TCNQ + 2-TNATA (185 nm) | NPD (10 nm) | 1% t(dta)py + $Alq_3$ (30 nm) | $Alq_3$ (20 nm) | LiF (0.5 nm)/Al (1.5 nm) | Ag (15 nm) | ZnS (25 nm) |
| COMPAR. EXAMPLE 2 | ITO (150 nm) | not given | not given | 0.1% F4-TCNQ + 2-TNATA (185 nm) | NPD (10 nm) | 1% t(dta)py + $Alq_3$ (30 nm) | $Alq_3$ (20 nm) | LiF (0.5 nm) | Al (80 nm) | not given |
| COMPAR. EXAMPLE 3 | ITO (150 nm) | not given | 33% $V_2O_5$ + 2-TNATA (20 nm) | 0.1% F4-TCNQ + 2-TNATA (165 nm) | NPD (10 nm) | 1% t(dta)py + $Alq_3$ (30 nm) | $Alq_3$ (20 nm) | LiF (0.5 nm) | Al (80 nm) | not given |

TABLE 2

| | Brightness (cd/m²) | Voltage (V) | Light emission efficiency (cd/A) | Color purity | Half-life (hr) |
|---|---|---|---|---|---|
| EXAMPLE 1 | 1833 | 7.66 | 12.2 | (0.16, 0.70) | 2,300 |
| EXAMPLE 2 | 1883 | 6.52 | 12.6 | (0.17, 0.70) | 1,000 |
| EXAMPLE 3 | 2029 | 6.96 | 13.5 | (0.20, 0.70) | 2,300 |
| EXAMPLE 4 | 2048 | 6.99 | 13.6 | (0.20, 0.70) | 2,300 |
| COMPAR. EXAMPLE 1 | 1821 | 6.38 | 12.1 | (0.18, 0.69) | 65 |
| COMPAR. EXAMPLE 2 | 1358 | 6.44 | 9.1 | (0.28, 0.62) | 1,000 |
| COMPAR. EXAMPLE 3 | 1358 | 6.38 | 9.1 | (0.28, 0.62) | 1,000 |

(5) A second hole-injection layer having a thickness of 170 nm is formed by performing a codeposition in accordance with a vacuum-deposition method, wherein a Ta boat and also a Ta boat are used for a 2-TNATA and a F4-TCNQ respectively so that the doping density of F4-TCNQ is 0.1% by weight.

(6) A hole-transport layer having a thickness of 10 nm is formed by performing a vapor deposition using a Ta boat to form a NPD layer.

(7) A light-emitting layer having a thickness of 30 nm is formed by performing a codeposition in accordance with a vacuum-deposition method, wherein a Ta boat and also a Ta boat are used for a t(dta)py and an $Alq_3$ respectively so that the doping density of t(dta)py is 1% by weight.

(8) An electron-transport layer having a thickness of 20 nm is formed by performing a vapor deposition using a Ta boat to form an $Alq_3$ layer.

(9) An electron-injection layer by performing a vapor deposition in accordance with a vacuum-deposition method using a Mo boat to form a LiF layer having a thickness of 0.5 nm; and further performing a vapor deposition in accordance with a vacuum-deposition method using a W filament to form an Al layer having a thickness of 1.5 nm, onto the LiF layer.

(10) A cathode having a thickness of 15 nm is formed by performing a vapor deposition using a Mo boat to form an Ag layer.

(11) A capping layer having a thickness of 25 nm is formed by performing a vapor deposition using a Mo boat to form a ZnS layer.

(12) A top-emission-type organic EL device obtained by the process (1) to (11) is sealed with a glass substrate using a UV adhesive, in a dried nitrogen atmosphere having a dew point temperature of −60° C. or below.

Example 6

In EXAMPLE 6, the substrate having the light-reflective anode thereon is further subjected to an oxygen plasma treatment for 1 minute at an output of 200 W and an $O_2$ flow rate of 0.2 sccm, which is not included in the process of EXAMPLE 5.

Example 7

In EXAMPLE 7, an Al—Nd light-reflective anode having a thickness of 100 nm is formed on the glass substrate by sputtering method, which is different from the Al light-reflective anode of EXAMPLE 5.

Thereafter, the substrate is subjected to a UV ozone treatment, as with EXAMPLE 5, and further subjected to an oxygen plasma treatment as with EXAMPLE 6.

An $MoO_3$ anode buffer layer is formed on the Al—Nd light-reflective anode, contrary to the Al light-reflective anode of EXAMPLE 5.

Example 8

In EXAMPLE 8, a light-reflective anode having a laminated structure of an Al—Nd film having a thickness of 100 nm and a Mo film having a thickness of 15 nm is formed on the glass substrate by sputtering method.

Thereafter, the substrate is subjected to a UV ozone treatment, as with EXAMPLE 5, and further subjected to an oxygen plasma treatment, as with EXAMPLE 6.

A first hole-injection layer having a thickness of 20 nm is formed on the Al—Nd/Mo anode by performing a codeposition in accordance with a vacuum-deposition method, wherein a Ta boat and a Mo boat are used for a 2-TNATA and a $V_2O_5$ respectively so that the doping density of $V_2O_5$ is 33% by weight.

[Evaluation]

Table 3 shows the structure of the devices in EXAMPLEs 5 to 8.

Table 4 shows the device characteristics when a drive current of 15 mA/cm². These organic EL devices all emit green light.

EXAMPLE 5 in which the surface of the Al light-reflective anode is subjected to a UV ozone treatment, and EXAMPLE 6 in which the surface of the Al light-reflective anode is subjected to an $O_2$ plasma treatment, both exhibited high degree of color purity, light-emission efficiency and operating life, which are as good as EXAMPLE 4.

EXAMPLE 7 having an Al—Nd anode also exhibits high degree of color purity and high light-emission efficiency as EXAMPLE 4, and surpasses COMPARATIVE EXAMPLE 2 in half-life of brightness.

EXAMPLE 8 having a Mo anode exhibits lower light-emission efficiency than EXAMPLEs 1 to 7, due to lower light reflectivity of the Mo light-reflective anode compared to Al, but surpasses COMPARATIVE EXAMPLEs 1 to 3 in half-life of brightness.

Therefore, the present invention provides a simple method to improve the life property of top-emission-type organic EL device using a highly light-reflective metal for the anode.

TABLE 3

|  | Anode | Anode buffer layer | 1st hole injection layer | 2nd hole injection layer | Hole transport layer | Light emitting layer | Electron transport layer | Electron injection layer | Cathode | Capping layer |
|---|---|---|---|---|---|---|---|---|---|---|
| EXAMPLE 5 | Al (60 nm) | $MoO_3$ (2 nm) | 30% $MoO_3$ + 2-TNATA (20 nm) | 0.1% F4-TCNQ + 2-TNATA (170 nm) | NPD (10 nm) | 1% t(dta)py + $Alq_3$ (30 nm) | $Alq_3$ (20 nm) | LiF (0.5 nm)/ Al (1.5 nm) | Ag (15 nm) | ZnS (25 nm) |
| EXAMPLE 6 | Al (60 nm) | $MoO_3$ (2 nm) | 30% $MoO_3$ + 2-TNATA (20 nm) | 0.1% F4-TCNQ + 2-TNATA (170 nm) | NPD (10 nm) | 1% t(dta)py + $Alq_3$ (30 nm) | $Alq_3$ (20 nm) | LiF (0.5 nm)/ Al (1.5 nm) | Ag (15 nm) | ZnS (25 nm) |
| EXAMPLE 7 | Al-Nd (100 nm) | $MoO_3$ (2 nm) | 30% $MoO_3$ + 2-TNATA | 0.1% F4-TCNQ + 2- | NPD (10 nm) | 1% t(dta)py + $Alq_3$ (30 nm) | $Alq_3$ (20 nm) | LiF (0.5 nm)/ | Ag (15 nm) | ZnS (25 nm) |

TABLE 3-continued

| | Anode | Anode buffer layer | 1st hole injection layer | 2nd hole injection layer | Hole transport layer | Light emitting layer | Electron transport layer | Electron injection layer | Cathode | Capping layer |
|---|---|---|---|---|---|---|---|---|---|---|
| | | | (20 nm) | TNATA (170 nm) | | | | Al (1.5 nm) | | |
| EXAMPLE 8 | Al-Nd (100 nm)/ Mo (15 nm) | not given | 33% $V_2O_5$ + 2-TNATA (20 nm) | 0.1% F4-TCNQ + 2-TNATA (170 nm) | NPD (10 nm) | 1% t(dta)py + $Alq_3$ (30 nm) | $Alq_3$ (20 nm) | LiF (0.5 nm)/ Al (1.5 nm) | Ag (15 nm) | ZnS (25 nm) |

TABLE 4

| | Brightness (cd/m$^2$) | Voltage (V) | Light emission efficiency (cd/A) | Color purity | Half-life (hr) |
|---|---|---|---|---|---|
| EXAMPLE 5 | 2032 | 6.93 | 13.6 | (0.18, 0.70) | 2,300 |
| EXAMPLE 6 | 1955 | 6.45 | 13.0 | (0.19, 0.70) | 2,300 |
| EXAMPLE 7 | 1912 | 7.98 | 12.8 | (0.21, 0.70) | 1,800 |
| EXAMPLE 8 | 1010 | 6.13 | 6.7 | (0.21, 0.67) | 2,300 |

Example 9

In EXAMPLE 9, an organic EL device is constituted in the same manner as EXAMPLE 6 except that a flexible substrate having SiNx gas barrier layers on both surfaces thereof is used instead of a glass substrate, and a SiNx sealing layer formed by sputtering method is used for sealing instead of UV adhesive.

The device of EXAMPLE 9 exhibits a light mission property which is equivalent to Example 6 and an excellent flexibility.

The present invention can be applied to many embodiments including the illustrative embodiments described above.

All applications, patent applications, and technical standards mentioned in this specification are herein incorporated by reference to the same extent as if each individually publication, patent application, or technical standard was specifically and individually indicated to be incorporated by reference.

What is claimed is:

1. An organic EL device comprising a substrate having at least a light-reflective anode, a hole-injection layer, a hole-transport layer, a light-emitting layer; an electron-transport layer and a light-transmitting cathode, which are sequentially laminated on the substrate, wherein the light-reflective anode side of hole-injection layer is doped with a metallic oxide, wherein the metallic oxide to be doped is $V_2O_5$ or MoO3.

2. The organic EL device of claim 1, wherein the light-reflective anode comprises Al or Al alloy.

3. The organic EL device of claim 1, wherein an anode buffer layer comprising a metal having a work function of 4.3 eV or more or an oxide thereof is sandwiched between the light-reflective anode and the hole-injection layer.

4. The organic EL device of claim 3, wherein an anode buffer layer comprising a material selected from the group consisting of $MoO_3$, $V_2O_5$, NiO, Mo and Ni is sandwiched between the light-reflective anode and the hole-injection layer.

5. The organic EL device of claim 1, wherein the light-reflective anode is subjected to a UV ozone surface treatment or an $O_2$ plasma surface treatment.

6. The organic EL device of claim 3, wherein the anode buffer layer is subjected to a UV ozone surface treatment or an $O_2$ plasma surface treatment.

7. The organic EL device of claim 1, wherein the doped metallic oxide is not present in the hole-transport layer side of the hole-injection layer.

8. The organic EL device of claim 1, wherein the light-transmitting cathode is a semi-transparent cathode comprising Ag or Ag alloy.

9. The organic EL device of claim 8, wherein the electron-injection layer comprising an alkaline metal compound and a thin film comprising Al having a thickness of 0.5 nm to 3 nm is sandwiched between the semi-transparent cathode comprising Ag or Ag alloy and the electron-transport layer.

10. The organic EL device of claim 8, wherein a capping layer comprising ZnS is laminated on the semi-transparent cathode comprising Ag or Ag alloy.

11. The organic EL device of claim 1, wherein the substrate is a flexible substrate.

12. An organic EL device comprising a substrate having at least a light-reflective anode, a hole-injection layer comprising a first hole-injection layer, and a second hole-injection layer, a hole-transport layer, a light-emitting layer, an electron-transport layer and a light-transmitting cathode, which are sequentially laminated in this order on the substrate, wherein the first hole-injection layer is doped with a metallic oxide.

13. The organic EL device of claim 12, wherein the metallic oxide to be doped is $V_2O_5$ or $MoO_3$.

14. The organic EL device of claim 12, wherein the light-reflective anode comprises Al or Al alloy.

15. The organic EL device of claim 12, wherein an anode buffer layer comprising a metal having a work function of 4.3 eV or more or an oxide thereof is sandwiched between the light-reflective anode and the first hole-injection layer.

16. The organic EL device of claim 15, wherein an anode buffer layer comprising a material selected from the group consisting of $MoO_3$, $V_2O_5$, NiO, Mo and Ni is sandwiched between the light-reflective anode and the first hole-injection layer.

17. The organic EL device of claim 12, wherein the light reflective anode is subjected to a UV ozone surface treatment or an $O_2$ plasma surface treatment.

18. The organic EL device of claim 15, wherein the anode buffer layer is subjected to a UV ozone surface treatment or an $O_2$ plasma surface treatment.

19. The organic EL device of claim 12, wherein the doped metallic oxide is not present in the second hole-injection layer.

20. The organic EL device of claim 12, wherein the light-transmitting cathode is a semi-transparent cathode comprising Ag or Ag alloy.

21. The organic EL device of claim 12, wherein the substrate is a flexible substrate.

* * * * *